(12) United States Patent
Tay et al.

(10) Patent No.: US 8,203,220 B2
(45) Date of Patent: Jun. 19, 2012

(54) INTEGRATED CIRCUIT PACKAGE SYSTEM WITH MULTIPLE DEVICE UNITS AND METHOD FOR MANUFACTURING THEREOF

(75) Inventors: Lionel Chien Hui Tay, Singapore (SG); Zigmund Ramirez Camacho, Singapore (SG); Jeffrey D. Punzalan, Singapore (SG); Arnel Trasporto, Singapore (SG)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 12/797,922

(22) Filed: Jun. 10, 2010

(65) Prior Publication Data

US 2010/0244273 A1    Sep. 30, 2010

Related U.S. Application Data

(63) Continuation of application No. 11/858,588, filed on Sep. 20, 2007, now Pat. No. 7,759,806.

(51) Int. Cl.
*H01L 23/02* (2006.01)
*H01L 21/00* (2006.01)

(52) U.S. Cl. ............... 257/787; 257/686; 257/E23.046; 438/109

(58) Field of Classification Search .................. 257/787, 257/686, E23.946; 438/109
See application file for complete search history.

(56) References Cited

U.S. PATENT DOCUMENTS

| | | | |
|---|---|---|---|
| 5,349,233 A | 9/1994 | Sasaki | |
| 6,133,629 A | 10/2000 | Han et al. | |
| 6,246,115 B1 | 6/2001 | Tang et al. | |
| 6,259,157 B1 | 7/2001 | Sakamoto et al. | |
| 6,352,632 B1 | 3/2002 | Inagaki et al. | |
| 6,399,423 B2 | 6/2002 | Matsuura et al. | |
| 6,759,753 B2 | 7/2004 | Chao | |
| 6,853,064 B2 | 2/2005 | Bolken et al. | |
| 6,927,480 B2 | 8/2005 | Lee et al. | |
| 7,012,324 B2 | 3/2006 | Li et al. | |
| 7,045,899 B2 * | 5/2006 | Yamane et al. | 257/777 |
| 7,157,292 B2 | 1/2007 | Huang | |
| 7,202,554 B1 | 4/2007 | Kim et al. | |
| 7,759,806 B2 * | 7/2010 | Tay et al. | 257/787 |
| 2002/0005576 A1 | 1/2002 | Sakamoto et al. | |
| 2002/0149099 A1 | 10/2002 | Shirasaka et al. | |
| 2004/0007771 A1 * | 1/2004 | Shin et al. | 257/686 |
| 2007/0241441 A1 | 10/2007 | Choi et al. | |
| 2007/0284139 A1 * | 12/2007 | Chin et al. | 174/260 |
| 2008/0185702 A1 * | 8/2008 | Camacho et al. | 257/686 |
| 2008/0308933 A1 * | 12/2008 | Tay et al. | 257/738 |

* cited by examiner

*Primary Examiner* — Kiesha Bryant
*Assistant Examiner* — Igwe U Anya
(74) *Attorney, Agent, or Firm* — Ishimaru & Associates LLP; Mikio Ishimaru; Stanley Chang

(57) ABSTRACT

A method for manufacturing an integrated circuit package system includes: forming a first device unit, having first external interconnects arranged along a perimeter of the first device unit, and a second device unit, having second external interconnects arranged along a perimeter of the second device unit, in an array configuration; mounting an integrated circuit die over the first device unit; connecting the integrated circuit die and the first external interconnects; encapsulating with an encapsulation covering the integrated circuit die, the first device unit, and the second device unit with both the first external interconnects and the second external interconnects partially exposed; and forming a partial encapsulation cut in the encapsulation electrically isolating the first external interconnects and the second electrical interconnects.

18 Claims, 9 Drawing Sheets

INTEGRATED CIRCUIT PACKAGE SYSTEM WITH MULTIPLE DEVICE UNITS AND METHOD FOR MANUFACTURING THEREOF

CROSS-REFERENCE TO RELATED APPLICATION(S)

This is a continuation of U.S. patent application Ser. No. 11/858,588, now U.S. Pat. No. 7,759,806, filed Sep. 20, 2007.

TECHNICAL FIELD

The present invention relates generally to integrated circuit package system and more particularly to integrated circuit package system with leads.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Many conventional semiconductor (or "chip") packages are of the type where a semiconductor die is molded into a package with a resin, such as an epoxy molding compound. The packages have a lead frame whose leads are projected from the package body, to provide a path for signal transfer between the die and external devices. Other conventional package configurations have contact terminals or pads formed directly on the surface of the package. Such a conventional semiconductor package is fabricated through the following processes: a die-bonding process (mounting the semiconductor die onto the paddle of a lead frame), a wire-bonding process (electrically connecting the semiconductor die on the paddle to inner leads using lead frame wires), a molding process (encapsulating a predetermined portion of the assembly, containing the die, inner leads and lead frame wires, with an epoxy resin to form a package body), and a trimming process (completing each assembly as individual, independent packages).

The semiconductor packages, thus manufactured, are then mounted by matching and soldering the external leads or contact pads thereof to a matching pattern on a circuit board, to thereby enable power and signal input/output ("I/O") operations between the semiconductor devices in the packages and the circuit board.

Different challenges arise from increased functionality integration and miniaturization. For example, a semiconductor product having increased functionality may be made smaller but may still be required to provide a large number of inputs/outputs (I/O). The size reduction increases the I/O density or decreases the I/O pitch for the integrated circuit package and its respective integrated circuit carriers.

The ever-increasing I/O density trend presents a myriad of manufacturing problems. Some of these problems reside in integrated circuit manufacturing realm, such as fine pitch connections and reliability of these connections. Others problems involve mounting these increase I/O density integrated circuits on carriers for packaging. Yet other problems reside in the realm of the printed circuit board or the system board that receives the integrated circuit package having the fine pitch I/O or a large number of I/Os in an ever-shrinking space.

An exemplary semiconductor package, well known in the electronics industry, is the quad flat package ("QFP"). QFP packages typically comprise a lead frame, such as a conductive sheet stamped and etched, with a semiconductor die having a multitude of bond pads mounted to the top side of the lead frame. Bond wires electrically connect the bond pads, of the semiconductor die, to a series of conductive lead fingers on the topside of the lead frame. Typically, the semiconductor die and the bond wires are encapsulated within a molding compound.

In order to reduce manufacturing costs, the electronics industry is increasing the usage of QFP packages. In the manufacturing process, many obstacles must be overcome to deliver extremely small packages with thinner and thinner profile in high volume while providing connectivity to a large number of I/O. Despite the trend towards miniaturization and thinner profile, more functions and more integrated circuits continue to be packed into QFP packages.

Thus, a need still remains for an integrated circuit package system providing low cost manufacturing, improved yield, and improved reliability. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method for manufacturing an integrated circuit package system including: forming a first device unit, having first external interconnects arranged along a perimeter of the first device unit, and a second device unit, having second external interconnects arranged along a perimeter of the second device unit, in an array configuration; mounting an integrated circuit die over the first device unit; connecting the integrated circuit die and the first external interconnects; encapsulating with an encapsulation covering the integrated circuit die, the first device unit, and the second device unit with both the first external interconnects and the second external interconnects partially exposed; and forming a partial encapsulation cut in the encapsulation electrically isolating the first external interconnects and the second electrical interconnects.

The present invention provides an integrated circuit package system including: a first device unit having first external interconnects along a perimeter of the first device unit; a second device unit, having second external interconnects along the perimeter of the second device unit, in an array configuration with the first device unit; an integrated circuit die over the first device unit and connected with the first external interconnects; and an encapsulation, having a partial cut, over the integrated circuit die, the device, the first device unit, and the second device unit with both the first external interconnects and the second external interconnects partially exposed with the partial cut electrically isolating the first external interconnects and the second electrical interconnects.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
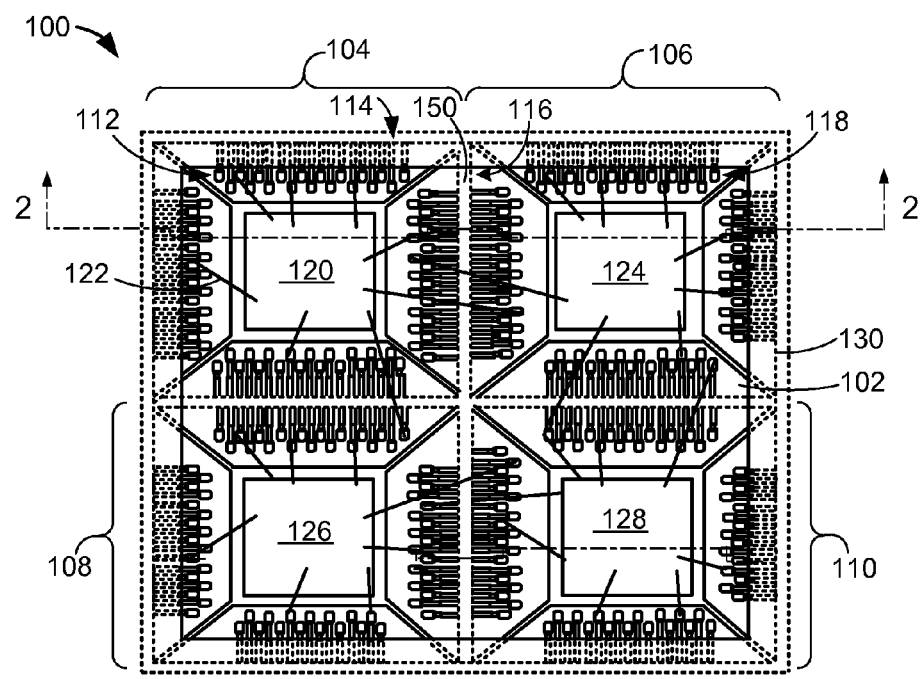
FIG. 1 is a top plan view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Generally, the invention can be operated in any orientation.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a top plan view of an integrated circuit package system 100 in a first embodiment of the present invention. The top plan view is shown without a top portion of an encapsulation 102 to show an array of device units in a 2×2 array configuration, as an example. A first device unit 104 is adjacent to a second device unit 106 and a third device unit 108, while a fourth device unit 110 is adjacent to the second device unit 106 and the third device unit 108, which collectively form an m×n array configuration. Although as shown, m=n in this example, it is understood that m need not necessarily be equal to n, and the array size can be of any size and dimension.

Each device unit includes external interconnects along a perimeter of that device unit. For example, the first device unit 104 includes first external interconnects 112 along a perimeter 114 of the first device unit 104. Preferably, the first external interconnects 112 include first inner external interconnects and first outer external interconnect, wherein the first inner external interconnects are offset to the first outer external interconnects, such that the first inner external interconnects are closer to the center of the first device unit 104 than the first outer external interconnects. The first inner external interconnects and the first outer external interconnects are referred to collectively as the first external interconnects 112.

Dam bars 116 are depicted by dotted lines and are removed forming partial encapsulation cuts 150 in the encapsulation 102 resulting in electrical isolation of previously connected external interconnects between the device units. For example, where the dam bars 116 is removed between the first device unit 104 and the second device unit 106, the first external interconnects 112 and second external interconnects 118 are electrically isolated, wherein the second device unit 106 includes the second external interconnects 118.

A first device 120, such as an integrated circuit die, is mounted over the first device unit 104 and selectively connected with electrical interconnects 122, such as bond wires or ribbon bond, between the first device 120 and the first external interconnects 112. Moreover, electrical connections can be made between the first device 120 and a second device 124, a third device 126 or a fourth device 128 with the electrical interconnects 122. The second device 124, the third device 126, and the fourth device 128 are mounted over the second device unit 106, the third device unit 108 and the fourth device unit 110, respectively.

The electrical interconnects 122 may connect between the first device 120 and the external interconnects, such as for example the second external interconnects 118, of another of the device unit. For example, the electrical interconnects 122 between the first device 120 and the second external interconnects 118 may be used to electrically connect the first device 120 to the second device 124.

The encapsulation 102 covers the array of the device units, including the first device unit 104, the second device unit 106, the third device unit 108, and the fourth device unit 110, and partially exposing a predetermined portion of the external interconnects of each of the device units. For example, the first external interconnects 112 are along a package side 130 of the integrated circuit package system 100 as well as the first external interconnects 112 adjacent to the second device unit 106, the third device unit 108, and the fourth device unit 110.

Additionally, although in this example, the first device 120 described is an integrated circuit die, it is understood that the first device 120 may also be any other type of active integrated circuit device, stacked devices, or a passive component device. It is also understood that the type of device, size and dimension of the device may vary from one device unit to another device unit. Accordingly, the integrated circuit package system 100 may accommodate multiple devices, active or passive devices, or devices of different types, size and dimensions.

It is understood that the descriptions for the first device 120 and the first device unit 104 are also applicable to the other devices and device units in the array of the device units. Accordingly, any device of one device unit may be electrically connected to another device mounted on another device unit by placements of the electrical interconnects 122 between that device and the external interconnects of the other device unit.

Figure 2:
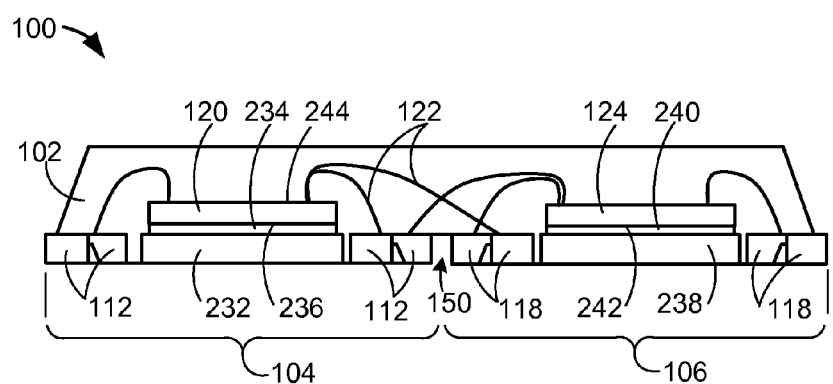
FIG. 2 is a cross-sectional view of the integrated circuit package system of FIG. 1 along a line 2-2.

Referring now to FIG. 2, therein is shown the cross-sectional view of the integrated circuit package system 100 of FIG. 1 along a line 2-2. The cross-sectional view depicts the first device unit 104 with the first external interconnects 112 and a first die-attach paddle 232. The first device 120 is mounted over the first die-attach paddle 232 with a first adhesive 234 and a first non-active side 236 of the first device 120 facing the first die-attach paddle 232. The second device unit 106 includes the second external interconnects 118 and a second die-attach paddle 238. The second device 124 is mounted over the second die-attach paddle 238 with a second adhesive 240 and a second non-active side 242 of the second device 124 facing the second die-attach paddle 238.

The electrical interconnects 122 electrically connects a first active side 244 of the first device 120 to the first external interconnects 112. The electrical interconnects 122 also connect the first device 120 to the second external interconnects 118 of the second device unit 106. The partial encapsulation cuts 150 are formed between the device units by removing the dam bars 116 of FIG. 1 resulting in electrical isolation of the external interconnects between the device units.

It is understood that the electrical interconnections described above is an example, and it is understood that numerous combinations and variations of electrical connections are possible between the first device 120 and the second device 124, as well as the third device 126 of FIG. 1 and the fourth device 128 of FIG. 1.

The encapsulation 102 covers the first device 120, the second device 124, the first device unit 104, the second device unit 106, and the electrical interconnects 122. Preferably, the encapsulation 102 partially exposes the first external interconnects 112, the second external interconnects 118, the first die-attach paddle 232, and the second die-attach paddle 238 such that the encapsulation 102 does not impede the connections of the external interconnects to the next system level (not shown), such as a printed circuit board or another integrated circuit package system.

It has been discovered that the present invention provides the integrated circuit package system 100 with reduced profile and high I/O connectivity by providing electrical connections between multiple device units in an array configuration. Devices of different size and configuration can also be accommodated within the array of the device units. It is also understood that the device type, size, and dimension may vary from one device unit to another device unit. Accordingly, the integrated circuit package system 100 may accommodate stacked devices, multiple devices, active or passive devices, of different types, sizes, and dimensions.

Figure 3:
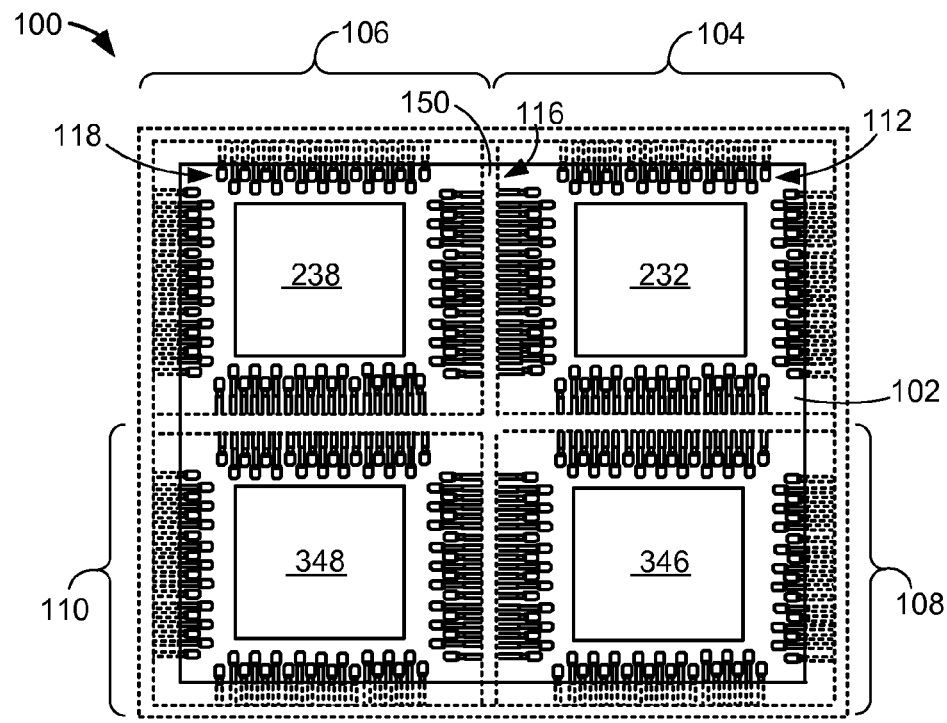
FIG. 3 is a bottom plan view of the integrated circuit package system of FIG. 1.

Referring now to FIG. 3, therein is shown is a bottom plan view of the integrated circuit package system 100 of FIG. 1. The integrated circuit package system 100 is shown without a bottom portion of the encapsulation 102 to partially expose the first external interconnects 112, the first die-attach paddle 232, the second external interconnects 118, and the second die-attach paddle 238. A third die-attach paddle 346 and a fourth die-attached paddle 348 are shown as well as the external interconnects for respectively the third device unit 108 and the fourth device unit 110.

The partial encapsulation cuts 150 depicted by dotted lines between the device units, such as between the first device unit 104 and the second device unit 106, depicts electrical isolation between the external interconnects, such as the first external interconnects 112 and the second external interconnects 118. The partial encapsulation cuts 150 are formed by the removal of the dam bars 116 of FIG. 1 that would otherwise electrically connect external interconnects between device units.

It is understood that the descriptions for the first device 120 of FIG. 1, the first device unit 104, and the first external interconnects 112 are also applicable to the other devices and device units in the array configuration of the device units.

Figure 4:
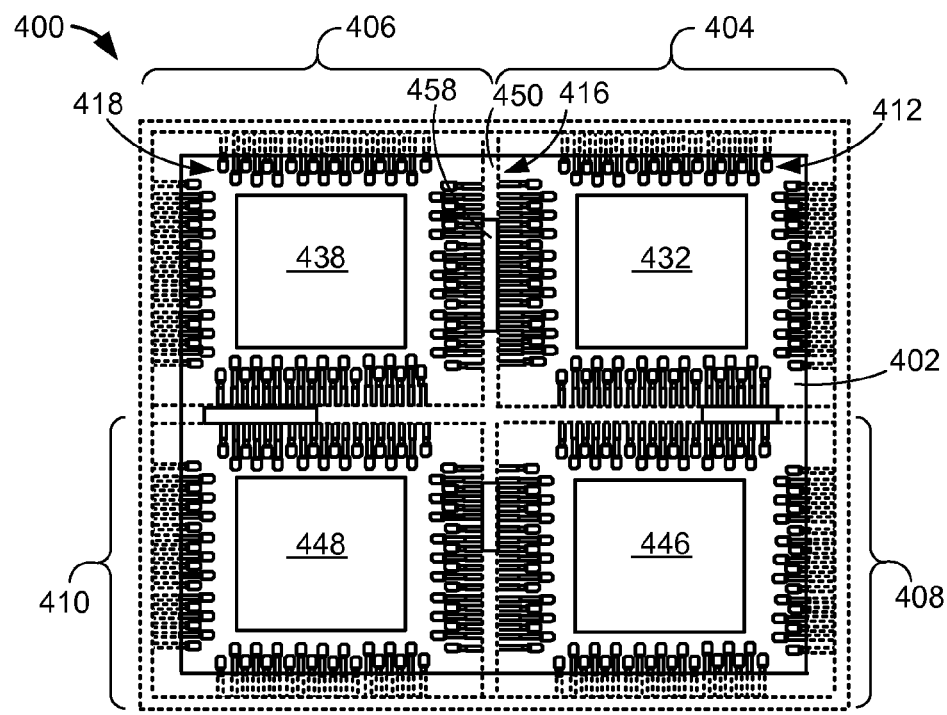
FIG. 4 is a bottom plan view of an integrated circuit package system in a second embodiment of the present invention.

Referring now to FIG. 4, therein is shown a bottom plan view of an integrated circuit package system 400 in a second embodiment of the present invention. The integrated circuit package system 400 includes structural similarities to the integrated circuit package system 100 of FIG. 1. The bottom plan view depicts the integrated circuit package system 400 without a bottom portion of an encapsulation 402 exposing first external interconnects 412, a first die-attach paddle 432, second external interconnects 418, and a second die-attach paddle 438. A third die-attach paddle 446 and a fourth die-attached paddle 448 are also shown as well as the external interconnects of a third device unit 408 and a fourth device unit 410.

Partial encapsulation cuts 450 are formed between the device units by removing the dam bars 416 resulting in electrical isolation of the external interconnects between the device units. A bridging structure 458, such as formed from remaining dam bar portions not removed, electrically connects a portion of the first external interconnects 412 and a portion of the second external interconnects 418. The bridging structure 458 between the device units may be formed in a number of configurations. For example, the bridging structure 458 may be formed in a horizontal or a vertical orientation in any number of patterns and lengths between the device units. The bridging structure 458 may function to connect the first external interconnects 412 and the second external interconnects 418 to a common reference source, such as ground, power source, or a reference signal.

Figure 5:
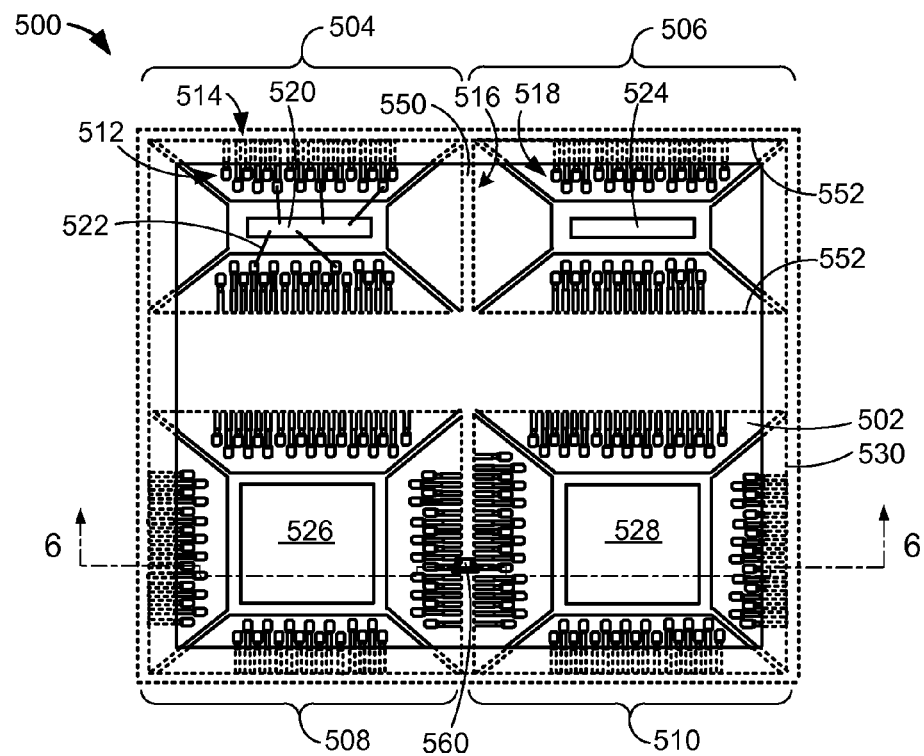
FIG. 5 is a top plan view of an integrated circuit package system in a third embodiment of the present invention.

Referring now to FIG. 5, therein is shown a top plan view of an integrated circuit package system 500 in a third embodiment of the present invention. The top plan view depicts the integrated circuit package system 500 without a top portion of an encapsulation 502. The integrated circuit package system 500 includes structural similarities to the integrated circuit package system 100 of FIG. 1. The top plan view depicts an array of device units in a 2×2 array configuration, as an example. A first device unit 504 is adjacent to a second device unit 506 and a third device unit 508, and a fourth device unit 510 is adjacent to the second device unit 506 and the third device unit 508, which collectively form an m×n array configuration. Although as shown, m=n in this example, it is understood that m need not necessarily be equal to n, and the array size can be of any size and dimension.

The first device unit 504 includes first external interconnects 512 formed along a first perimeter 514 of the first device unit 504. In this embodiment, the first external interconnects 512 and second external interconnects 518 are formed along two unit sides 552 for each of the first device unit 504 and the second device unit 506. Dam bars 516 are depicted by dotted lines and are removed forming partial encapsulation cuts 550 in the encapsulation 102 resulting in electrical isolation of previously connected external interconnects between the device units. For example, where the dam bars 516 are removed between the first device unit 504 and the second device unit 506, the first external interconnects 512 and the second external interconnects 518 are electrically isolated, wherein the second device unit 506 includes the second external interconnects 518.

A first device 520, such as an integrated circuit die, is mounted over the first device unit 504 and selectively connected with electrical interconnects 522, such as bond wires or ribbon bond, between the first device 520 and the first external interconnects 512. Moreover, electrical connections can be made between the first device 520 and a second device 524, a third device 526 or a fourth device 528 with the electrical interconnects 522. The second device 524, the third device 526, and the fourth device 528 are mounted over the second device unit 506, the third device unit 508 and the fourth device unit 510, respectively.

The electrical interconnects 522 may connect between the first device 520 and the external interconnects, for example, the second external interconnects 518, of another device units. For example, the first external interconnects 512 between the first device 520 and the second external interconnects 518 may be used to electrically connect the first device 520 to the second device 524.

In this embodiment, the first device 520 and the second device 524 are of similar size, shape and dimension, while the third device 526 and the fourth device 528 are of similar size, shape, and dimension. Additionally, the number of external interconnects of the first device unit 504 may differ from the number external interconnects of another device unit, such as that shown for the third device unit 508. It is understood that the array of the device units may be modified to accommodate other variations or combinations of stacked devices, device sizes, shapes, and dimensions including a different height of the devices or the number of external interconnects.

It is also understood that one of the benefits of the integrated circuit package system 500 is that it can be modified to accommodate different layouts of external interconnects. Optionally, the first external interconnects 512 may be selectively connected by the bridging structure 458 of FIG. 4, of a predetermined length. For example, a structure similar to the bridging structure 458 may electrically connect a predetermined portion of the first external interconnects 512 and a predetermined portion of the external interconnects between the first device unit 504 and the third device unit 508, as an example.

The encapsulation 502 covers the array of the device units including the first device unit 504, the second device unit 506, the third device unit 508, and the fourth device unit 510 and partially exposing a predetermined portion of the external interconnects of each of the device units. For example, the first external interconnects 512 are along a package side 530 of the integrated circuit package system 500 as well as the first external interconnects 512 adjacent to the third device unit 508 and the fourth device unit 510.

Additionally in this example, the first device 520 described is an integrated circuit die, it is understood that the first device 520 may also be any other type of active integrated circuit device, or a passive component device. It is also understood that the type of device, size and dimension of the device may vary from one device unit to another device unit. Optionally, a passive device 560, such as a capacitor, a resistor, an inductor, or a combination thereof, may be optionally mounted between the external interconnects. Accordingly, the integrated circuit package system 500 may accommodate stacked devices, multiple devices, active or passive devices, or devices of different types, sizes, and dimensions.

It is understood, that the descriptions for the first device 520 and the first device unit 504 are also applicable to the other devices and device units in the array of the device units. Accordingly, any device of one device unit may be electrically connected to another device mounted on another device unit by placements of the electrical interconnects 522 between the device and the external interconnects of another device unit.

Figure 6:
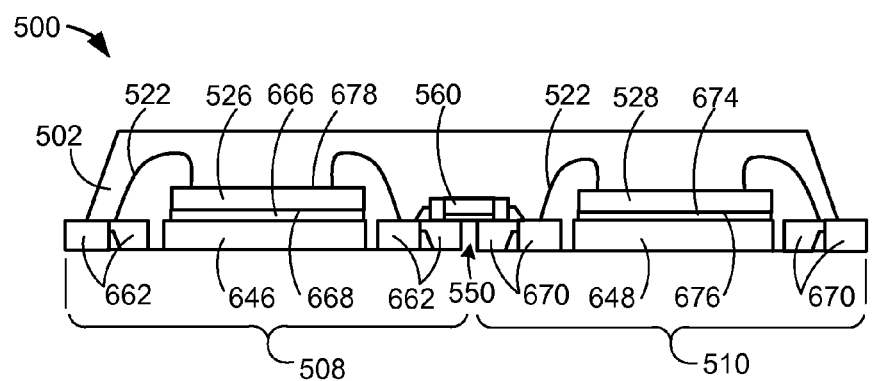
FIG. 6 is a cross-sectional view of the integrated circuit package system of FIG. 5 along a line 6-6.

Referring now to FIG. 6, therein is shown the cross-sectional view of the integrated circuit package system of FIG. 5 along a line 6-6. The cross-sectional view depicts the third device unit 508 with third external interconnects 662, and a third die-attach paddle 646. The third device 526 is mounted over the third die-attach paddle 646 with a third adhesive 666 and a third non-active side 668 of the third device 526 facing the third die-attach paddle 646. The fourth device unit 510 includes fourth external interconnects 670 and a fourth die-attach paddle 648. The fourth device 528 is mounted over the fourth die-attach paddle 648 with a fourth adhesive 674 and a fourth non-active side 676 of the fourth device 528 facing the fourth die-attach paddle 648.

The electrical interconnects 522 electrically connects a third active side 678 of the third device 526 to the third external interconnects 662. The electrical interconnects 522 also connects the fourth device 528 to the fourth external interconnects 670 of the fourth device unit 510. Additionally, as shown, the passive device 560, such as a capacitor, a resistor, an inductor, or a combination thereof, may be optionally mounted over external interconnects between device units, such as the external interconnects between the third device unit 508 and the fourth device unit 510. The partial encapsulation cuts 550 are formed between the device units by removing the dam bars 516 of FIG. 5 resulting in electrical isolation of the external interconnects between the device units.

It is understood that the electrical interconnections described above is an example, and it is understood that many combinations and variation of electrical connections are possible between the first device 520 of FIG. 5 and the second device 524 of FIG. 5 as well as the third device 526 and the fourth device 528.

The encapsulation 502 covers the third device 526 the fourth device 528, the third device unit 508, the fourth device unit 510, as well as the electrical interconnects 522. Preferably, the encapsulation 502 partially exposes the third external interconnects 662, the fourth external interconnects 670, the third die-attach paddle 646, and the fourth die-attach paddle 648 such that the encapsulation 502 does not impede the connections of the external interconnects to the next system level.

It has been discovered that the present invention provides the integrated circuit package system 500 with reduced profile and high I/O connectivity by providing easy electrical connections between multiple device units in an array configuration. Devices of different size and configuration can also be accommodated within the array of the device units. It is also understood that the device type, size, and dimension of the device may vary from one device unit to another device unit. Accordingly, the integrated circuit package system 500 may accommodate stacked devices, multiple devices, active or passive devices, of different types, size and dimension.

Figure 7:
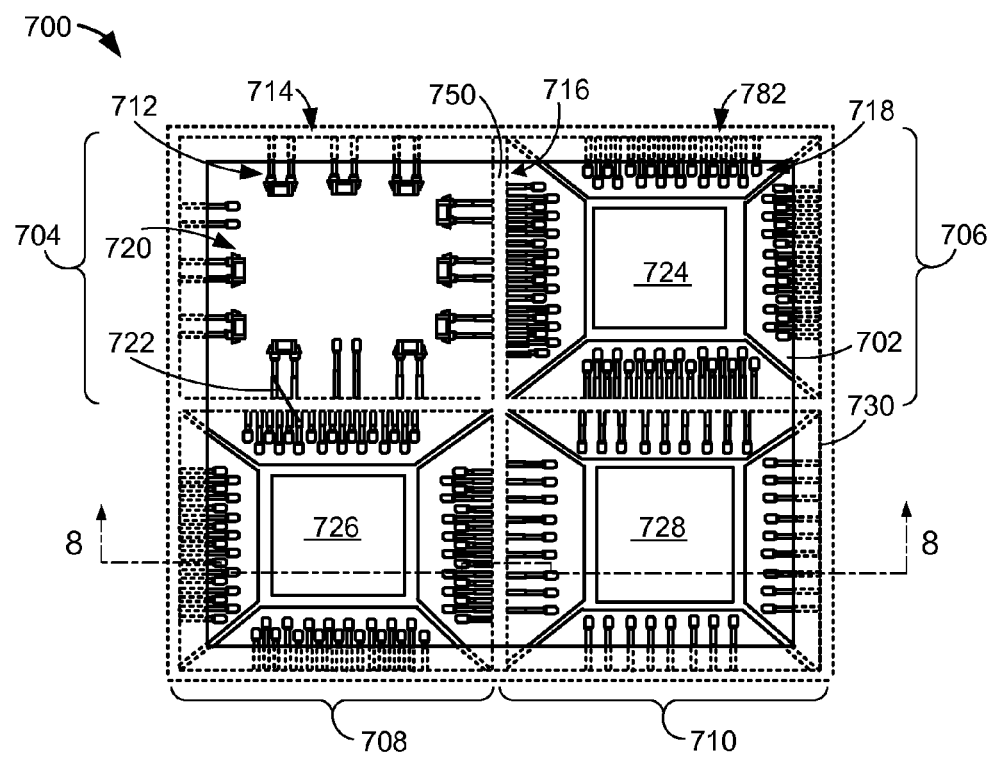
FIG. 7 is a top plan view of an integrated circuit package system in a fourth embodiment of the present invention.

Referring now to FIG. 7, therein is shown a top plan view of an integrated circuit package system 700 in a fourth embodiment of the present invention. The integrated circuit package system 700 includes structural similarities to the integrated circuit package system 500 of FIG. 5. The top plan view is shown without a top portion of an encapsulation 702 to show an array of device units in a 2×2 array configuration shown as an example. A first device unit 704 is adjacent to a second device unit 706 and a third device unit 708, while a fourth device unit 710 is adjacent to the second device unit 706 and the third device unit 708, which collectively form an array of m×n array configuration. Although as shown, m=n in this example, it is understood that m need not necessarily be equal to n, and the array size can be of any size and dimension.

Each device unit includes external interconnects along a perimeter of that device unit. For example, the first device unit 704 includes first external interconnects 712 formed along a first perimeter 714 of the first device unit 704. In this embodiment, the first external interconnects 712 comprises terminations of a passive component, such as a capacitor, resistor, inductor, or other such passive devices. Second external interconnects 718 of the second device unit 706 are formed along a second perimeter 782 of the second device unit 706, and similarly with the third device unit 708 and the fourth device unit 710.

A first device 720, a passive component, such as a capacitor, resistor, inductor, or other such passive devices, is mounted over the first device unit 704 and selectively connected with electrical interconnects 722, such as bond wires or ribbon bond, between the first device 720 and other external interconnects. For example, electrical connections can be made between the first device 720 and a second device 724, a third device 726 or a fourth device 728 with the electrical interconnects 722. The second device 724, the third device 726, and the fourth device 728 are mounted over the second device unit 706, the third device unit 708 and the fourth device unit 710, respectively. The second device 724, the third device 726, and the fourth device 728 may each comprise an integrated circuit die, or another active or a passive component.

In this embodiment, the second device 724, the third device 726 and the fourth device 728 are of similar size, shape and dimension, while the first device 720 comprises multiple passive components, such as capacitors, resistors and inductors or other such passive components. It is understood that the array of device units may be modified to accommodate other variations or combinations of stacked devices, device size, shape, and dimension, including a different heights of the devices.

Dam bars 716 are depicted by dotted lines and are removed forming partial encapsulation cuts 750 in the encapsulation 702 resulting in electrical isolation of previously connected external interconnects between the device units. For example, where the dam bars 716 is removed between the first device unit 704 and the second device unit 706, the first external interconnects 712 and the second external interconnects 718 are electrically isolated, wherein the second device unit 706 includes the second external interconnects 718.

The encapsulation 702 surrounds the array of the device units, including the first device unit 704, the second device unit 706, the third device unit 708, and the fourth device unit 710, and partially exposing some of the external interconnects of each of the device unit along a package side 730 of the integrated circuit package system 700, such as some of the first external interconnects 712 at the package side 730.

It is understood that one of the benefits of the integrated circuit package system 700 is that it can be modified to accommodate different layouts of external interconnects as is needed depending on the device types, sizes and dimensions, as well as the functionality of the device mounted in each device unit. Moreover, the size of each device unit may be adapted to a predetermined device size and dimension. In this embodiment, the first device unit 704 described comprises one or more passive components, it is understood that the number and combinations of devices, as well as the device types, shapes, and sizes may vary from active integrated circuit devices to passive component devices, and combinations thereof from one device unit to another. Accordingly, the integrated circuit package system 700 may accommodate stacked devices, multiple devices, active or passive devices, or devices of different types, size and dimensions.

It is understood, what is described relative to one device and one device unit is also applicable to the other devices and device units in the array of device units. Accordingly, any device of one device unit may be electrically connected to another device mounted on another device unit by placements of electrical interconnects between the device and the inner external interconnect and/or the outer external interconnect of another device unit.

Figure 8:
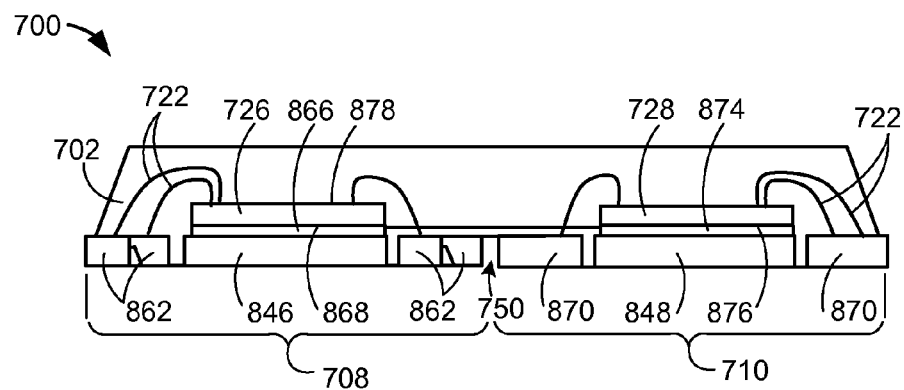
FIG. 8 is a cross-sectional view of the integrated circuit package system of FIG. 7 along a line 8-8.

Referring now to FIG. 8, therein is shown the cross-sectional view of the integrated circuit package system of FIG. 7 along a line 8-8. The cross-sectional view depicts the third device unit 708 with third external interconnects 862, and a third die-attach paddle 846. The third device 726 is mounted over the third die-attach paddle 846 with a third adhesive 866 and a third non-active side 868 of the third device 726 facing the third die-attach paddle 846. The fourth device unit 710 includes fourth external interconnects 870 and a fourth die-attach paddle 848. The fourth device 728 is mounted over the fourth die-attach paddle 848 with a fourth adhesive 874 and a fourth non-active side 876 of the fourth device 728 facing the fourth die-attach paddle 848.

The electrical interconnects 722 electrically connects a third active side 878 of the third device 726 to the third external interconnects 862. The electrical interconnects 722 also connects the fourth device 728 to the fourth external interconnects 870 of the fourth device unit 710. It is understood that the electrical interconnections described is an example, and it is understood that many combinations and variation of electrical connections are possible between the first device 720 of FIG. 7 and the second device 724 of FIG. 8, as well as the third device 726 and the fourth device 728. The partial encapsulation cuts 750 are formed between the device units by removing the dam bars 716 of FIG. 7 resulting in electrical isolation of the external interconnects between the device units.

The encapsulation 702 covers the third device 726 the fourth device 728, the third device unit 708, the fourth device unit 710, as well as the electrical interconnects 722. Preferably, the encapsulation 702 partially exposes the third external interconnects 862, the fourth external interconnects 870, the third die-attach paddle 846, and the fourth die-attach paddle 848 such that the encapsulation 702 does not impede the connections of the external interconnects to the next system level.

It has been discovered that the present invention provides the integrated circuit package system 700 with reduced profile and high I/O connectivity by providing easy electrical connections between multiple device units in an array configuration. Devices of different size and configuration can also be accommodated within the array of multiple device units. It is also understood that the type of device, size and dimension of the device may vary from one device unit to another device unit. Accordingly, the integrated circuit package system 700 may accommodate stacked devices, multiple devices, active or passive devices, of different types, size and dimension.

Figure 9:
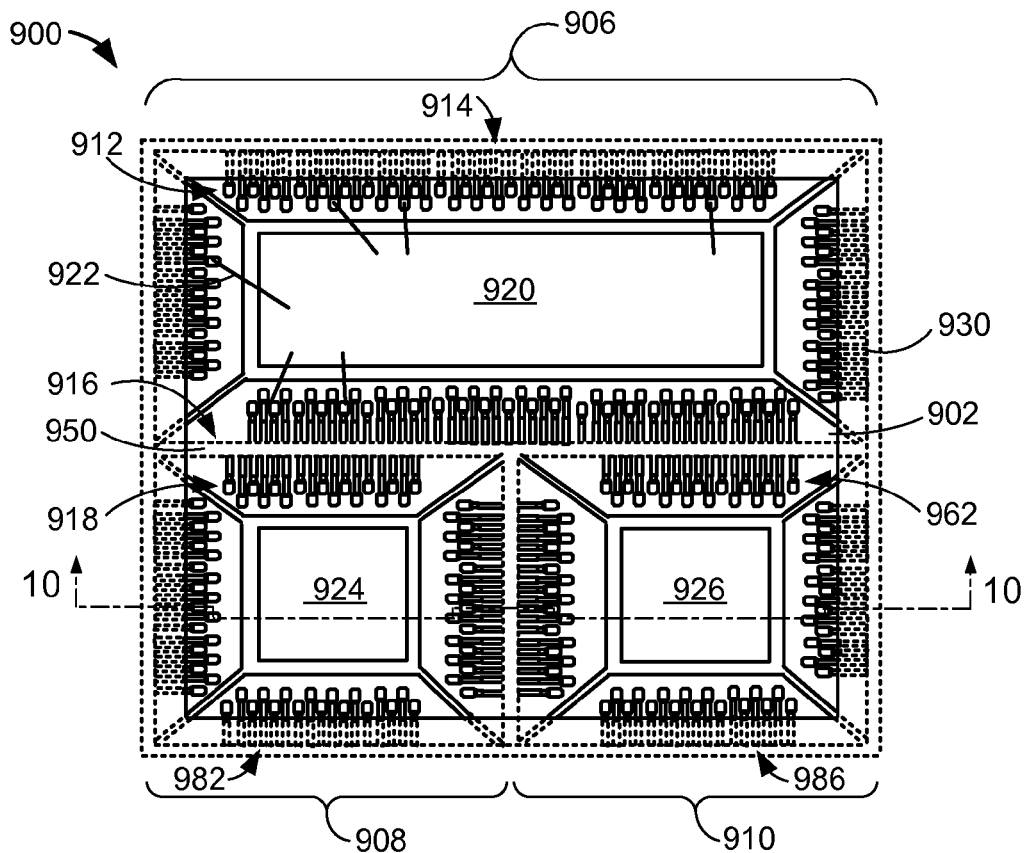
FIG. 9 is a top plan view of an integrated circuit package system in a fifth embodiment of the present invention.

Referring now to FIG. 9, therein is shown a top view of an integrated circuit package system 900 in a fifth embodiment of the present invention. The top plan view depicts the integrated circuit package system 900 without a top portion of an encapsulation 902. The integrated circuit package system 900 includes structural similarities to the integrated circuit package system 500 of FIG. 5. A first device unit 906 is adjacent to a second device unit 908 and a third device unit 910, which collectively form an array configuration. In this embodiment, the first device unit 906 is larger in size and dimension than the second device unit 908 or the third device unit 910.

Each device unit include external interconnects formed along a perimeter of that device unit. For example, the first device unit 906 includes first external interconnects 912 formed along a first perimeter 914 of the first device unit 906. The second device unit 908 includes second external interconnects 918 formed along a second perimeter 982 of the second device unit 908. The third device unit 910 includes third external interconnects 962 formed along a third perimeter 986 of the third device unit 910. Dam bars 916 are depicted by dotted lines and are removed forming partial encapsulation cuts 950 in the encapsulation 902 resulting in electrical isolation of previously connected external interconnects between the device units. For example, the second external interconnects 918 and the third external interconnects 962 between the second device unit 908 and the third device unit 910 are electrically isolated from the other with the dam bars 916 removed.

A first device 920, such as an integrated circuit die, is mounted over the first device unit 906 and selectively connected with electrical interconnects 922, such as bond wires or ribbon bond, between the first device 920 and the first external interconnects 912. Moreover, electrical connections can be easily made between the first device 920 and a second device 924, or a third device 926 by simple placement of the electrical interconnects 922 between the first device 920 and the external interconnects of another device in the array of device units.

The second device 924 and the third device 926 are mounted over the second device unit 908 and the third device unit 910, respectively. In this embodiment, the first device unit 906 is different in size, shape, and height from the second device unit 908 and the third device unit 910. It is understood that each device unit in the array of device units may be different and that the array of device units may be modified for variations or combinations of different device unit sizes, shapes, and dimensions.

The encapsulation 902 surrounds the array of the device units, including the first device unit 906, the second device unit 908, the third device unit, and partially exposing some of the external interconnects of each of the device unit along a package side 930 of the integrated circuit package system 900, such as some of the first external interconnects 912 at the package side 930.

Additionally, although in this example, the first device 920 described is an integrated circuit die, it is understood that the first device 920 may also be any other type of stacked devices, active integrated circuit device, or a passive component device. It is also understood that the device types, sizes and dimensions of the device may vary from one device unit to another device unit. Accordingly, the integrated circuit package system 900 may accommodate multiple devices, active or passive devices, or devices of different types, sizes and dimensions.

Figure 10:
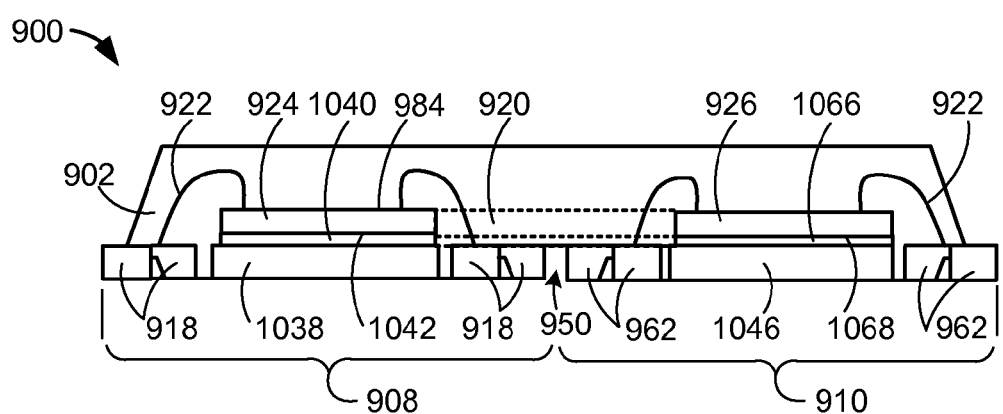
FIG. 10 is a cross-sectional view of the integrated circuit package system of FIG. 9 along a line 10-10.

Referring now to FIG. 10, therein is shown the cross-sectional view of the integrated circuit package system of FIG. 9 along a line 10-10. The cross-sectional view depicts the second device unit 908 with the second external interconnects 918 and a second die-attach paddle 1038. The second device 924 is mounted with a second adhesive 1040, with a second non-active side 1042 of the second device 924 over the second die-attach paddle 1038. The third device unit 910 includes the third external interconnects 962 and a third die-attach paddle 1046. The third device 926 is mounted with a third adhesive 1066, with a third non-active side 1068 of the third device 926 over the third die-attach paddle 1046. The first device 920 of FIG. 9 shown in dotted lines illustrates the different device sizes and dimensions, as well as that of the device units, which may be accommodated.

The electrical interconnects 922 electrically connects a second active side 984 of the second device 924 to the second external interconnects 918. The electrical interconnects 922 also connects the third device 926 to the third external interconnects 962 of the third device unit 910. The partial encapsulation cuts 950 are formed between the device units by removing the dam bars 916 of FIG. 9 resulting in electrical isolation of the external interconnects between the device units.

It is understood that the electrical interconnections described above is an example, and it is understood that many combinations and variation of electrical connections are possible between the first device 920, the second device 924, and the third device 926.

The encapsulation 902 covers the second device 924, the third device 926, the second device unit 908, the third device unit 910, as well as the electrical interconnects 922. Preferably, the encapsulation 902 partially exposes the second external interconnects 918, the third external interconnects 962, the second die-attach paddle 1038, and the third die-attach paddle 1046 such that the encapsulation 902 does not impede the connections of the external interconnects to the next system level.

Figure 11:
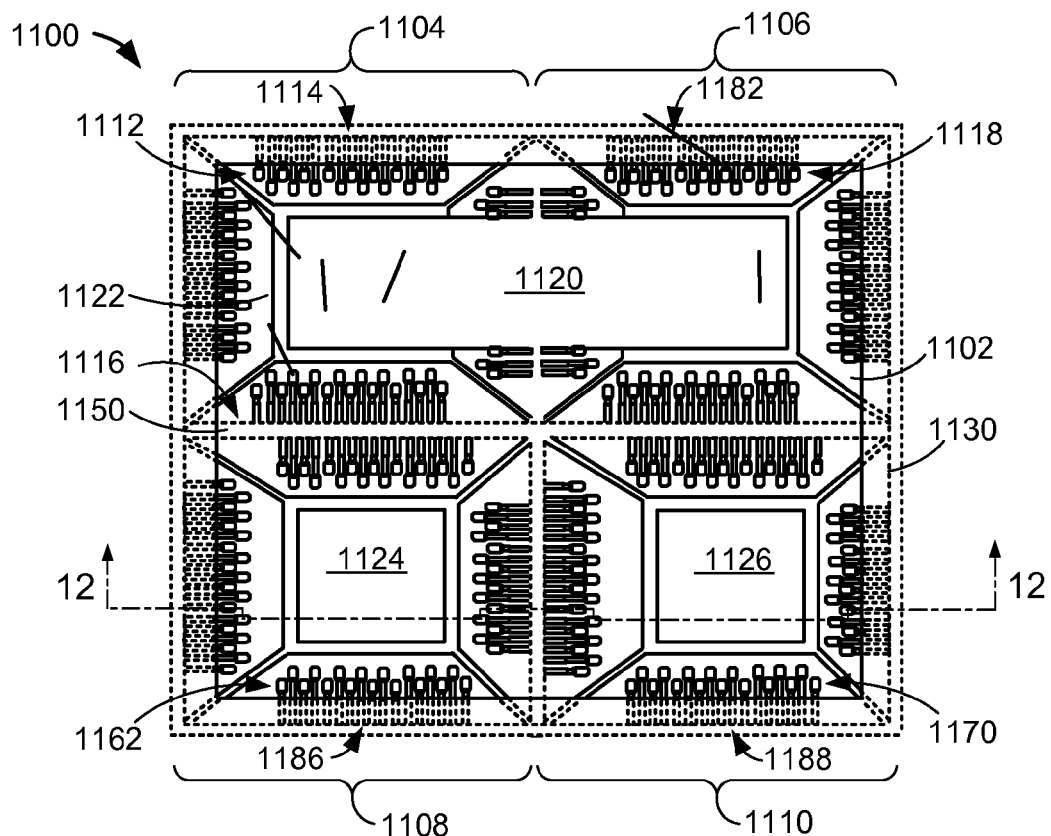
FIG. 11 is a top plan view of an integrated circuit package system in a sixth embodiment of the present invention.

Referring now to FIG. 11, therein is shown a top view of an integrated circuit package system 1100 in a sixth embodiment of the present invention. The top plan view depicts the integrated circuit package system 1100 without a top portion of an encapsulation 1102. The integrated circuit package system 1100 includes structural similarities to the integrated circuit package system 900 of FIG. 9. A first device unit 1104 is adjacent to a second device unit 1106 and a third device unit 1108, and a fourth device unit 1110 which collectively form an array configuration.

Each device unit include external interconnects formed along a portion of a perimeter of that device unit. For example, the first device unit 1104 includes first external interconnects 1112 formed along a portion of first perimeter 1114 of the first device unit 1104. The second device unit 1106 includes second external interconnects 1118 formed along a portion of a second perimeter 1182 of the second device unit 1106. The third device unit 1108 includes third external interconnects 1162 formed along a third perimeter 1186 of the third device unit 1108. The fourth device unit 1110 includes fourth external interconnects 1170 formed along a fourth perimeter 1188.

Preferably, dam bars 1116 are depicted by dotted lines and are removed forming partial encapsulation cuts 1150 in the encapsulation 1102 resulting in electrical isolation of previously connected external interconnects between the device units. For example, where the dam bars 1116 is removed between the third device unit 1108 and the fourth device unit 1110, the third external interconnects 1162 and the fourth external interconnects 1170 and are electrically isolated from the other.

In this embodiment, a first device 1120, such as an integrated circuit die is mounted over two device units, such as the first device unit 1104 and the second device unit 1106, and selectively connected with electrical interconnects 1122, such as bond wires or ribbon bond, between the first device 1120 and the first external interconnects 1112 and the second external interconnects 1118. Moreover, electrical connections can be easily made between the first device 1120 and another device by simple placement of the electrical interconnects 1122 between the first device 1120 and the external interconnects of another device in the array of device units.

A second device 1124 and a third device 1126 are mounted over the third device unit 1108 and the fourth device unit 1110, respectively. In this embodiment, the first device 1120 is different in size, shape, and height, from the other devices in the array of device units. It is understood that each device unit in the array of device units may be different and that the array of device units may be modified for variations or combinations of different stacked devices, device types, sizes, and dimension.

The encapsulation 1102 surrounds the array of the device units, including the first device unit 1104, the second device unit 1106, the third device unit 1108 and the fourth device unit 1110, and partially exposing some of the external interconnects of each of the device unit along a package side 1130 of the integrated circuit package system 1100, such as some of the first external interconnects 1112 at the package side 1130.

Additionally, although in this example, the first device 1120 described is an integrated circuit die, it is understood that the first device 1120 may also be any other type of stacked devices, active integrated circuit device, or a passive component device. It is also understood that the device types, sizes and dimensions of the device may vary from one device unit to another device unit. Accordingly, the integrated circuit package system 1100 may accommodate multiple devices, active or passive devices, or devices of different types, sizes and dimensions.

Figure 12:
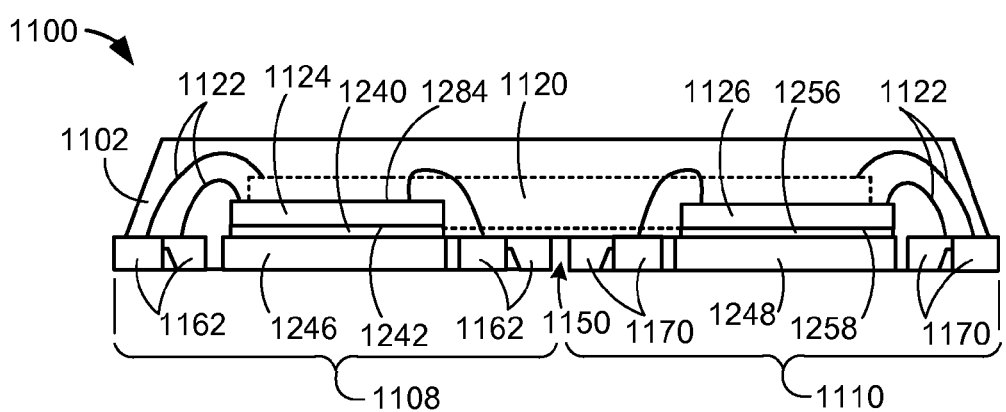
FIG. 12 is a cross-sectional view of the integrated circuit package system of FIG. 11 along a line 12-12.

Referring now to FIG. 12, therein is shown the cross-sectional view of the integrated circuit package system of FIG. 11 along a line 12-12. The cross-sectional view depicts the third device unit 1108 with the third external interconnects 1162 and a third die-attach paddle 1246. The second device 1124 is mounted with a second adhesive 1240, with a second non-active side 1242 of the second device 1124 over the third die-attach paddle 1246. The fourth device unit 1110 includes the fourth external interconnects 1170 and a fourth die-attach paddle 1248. The third device 1126 is mounted with a third adhesive 1256, with a third non-active side 1258 of the third device 1126 over the fourth die-attach paddle 1248. In this embodiment, dotted lines depict the first device 1120, which is of a greater height in device dimension than the second device 1124 or the third device 1126.

The electrical interconnects 1122 electrically connects a second active side 1284 of the second device 1124 to the third external interconnects 1162. The electrical interconnects 1122 also connects the third device 1126 to the fourth external interconnects 1170 of the third device unit 1108. The partial encapsulation cuts 1150 are formed between the device units by removing the dam bars 1116 of FIG. 11 resulting in electrical isolation of the external interconnects between the device units. It is understood that the electrical interconnections described above is an example, and it is understood that many combinations and variation of electrical connections are possible between the first device 1120 covers the second device 1124, the third device 1126, the second device unit 1106, the third device unit 1108, as well as the electrical interconnects 1122. Preferably, the encapsulation 1102 partially exposes the third external interconnects 1162, the fourth external interconnects 1170, the third die-attach paddle 1246, and the fourth die-attach paddle 1248 such that the encapsulation 1102 does not impede the connections of the external interconnects to the next system level.

Figure 13:
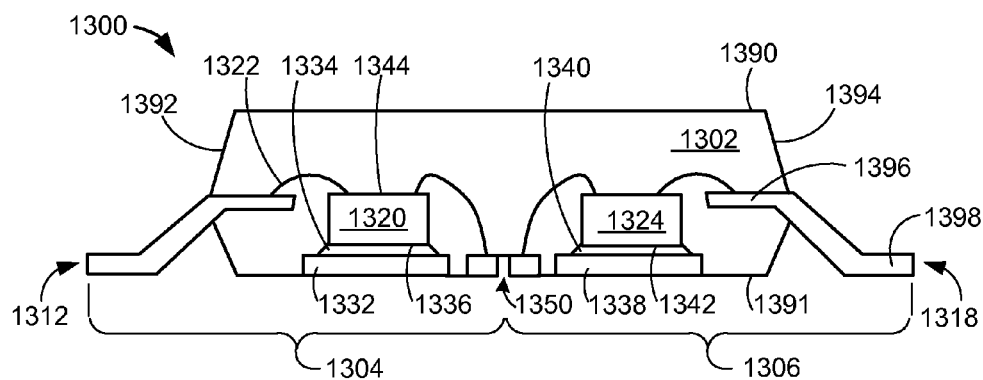
FIG. 13 is a cross-sectional view of an integrated circuit package system in a seventh embodiment of the present invention.

Referring now to FIG. 13, therein is shown a cross-sectional view of an integrated circuit package system 1300 system as exemplified by the top plan view of FIG. 1 along line 2-2 in a seventh embodiment of the present invention. The integrated circuit package system 1300 includes structural similarities to the integrated circuit package system 100 of FIG. 2. The cross-sectional view depicts a first device unit 1304 with first external interconnects 1312 and a first die-attach paddle 1332. A first device 1320 is mounted over the first die-attach paddle 1332 with a first adhesive 1334 and a first non-active side 1336 of the first device 1320 facing the first die-attach paddle 1332. A second device unit 1306 includes second external interconnects 1318 and a second die-attach paddle 1338. A second device 1324 is mounted over the second die-attach paddle 1338 with a second adhesive 1340 and a second non-active side 1342 of the second device 1324 facing the second die-attach paddle 1338.

Electrical interconnects 1322 electrically connects a first active side 1344 of the first device 1320 to the first external interconnects 1312. The electrical interconnects 1322 also connects the second device 1324 to the second external interconnects 1318 of the second device unit 1306. The partial encapsulation cuts 1350 are formed between the device units by removing the dam bars 116 of FIG. 1 resulting in electrical isolation of the external interconnects between the device units.

An encapsulation 1302 covers the first device 1320, the second device 1324, the first device unit 1304, the second device unit 1306, as well as the electrical interconnects 1322. Preferably, the encapsulation 1302 partially exposes the first external interconnects 1312, the second external interconnects 1318, the first die-attach paddle 1332, and the second die-attach paddle 1338 such that the encapsulation 1302 does not impede the connections of the external interconnects to the next system level. The encapsulation 1302 comprises a first encapsulation side 1390 and a second encapsulation side 1391, on an opposing side of the first encapsulation side 1390. The encapsulation 1302 partially exposes the first external interconnects 1312 at a first lateral side 1392 of the encapsulation 1302 and the second external interconnects 1318 at a second lateral side 1394 of the encapsulation 1302.

Each of the first external interconnects 1312 and the second external interconnects 1318 comprises a tip 1396 and a termination 1398, with the termination 1398 angled from the tip 1396 to terminate coplanar to the second encapsulation side 1391. The encapsulation 1302 partially exposes the first die-attach paddle 1332, the second die-attach paddle 1338 on the second encapsulation side 1391, which together with the first external interconnects 1312 and the second external interconnects 1318 allow electrical connection to a next system level connection.

Figure 14:
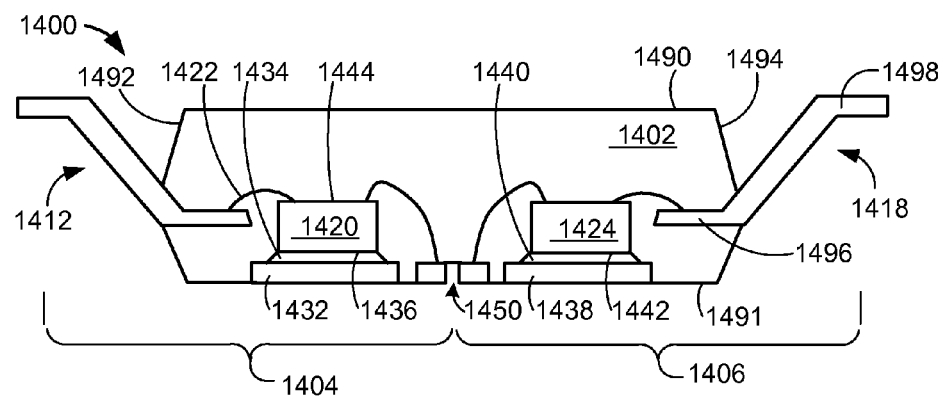
FIG. 14 is a cross-sectional view of an integrated circuit package system in an eighth embodiment of the present invention.

Referring now to FIG. 14, therein is shown a cross-sectional view of an integrated circuit package system 1400 system as exemplified by the top plan view of FIG. 1 along line 2-2 in an eighth embodiment of the present invention. The integrated circuit package system 1400 includes structural similarities to the integrated circuit package system 1300 of FIG. 13. The cross-sectional view depicts a first device unit 1404 with first external interconnects 1412 and a first die-attach paddle 1432. A first device 1420 is mounted over the first die-attach paddle 1432 with a first adhesive 1434 and a first non-active side 1436 of the first device 1420 facing the first die-attach paddle 1432. A second device unit 1406 includes second external interconnects 1418 and a second die-attach paddle 1438. A second device 1424 is mounted over the second die-attach paddle 1438 with a second adhesive 1440 and a second non-active side 1442 of the second device 1424 facing the second die-attach paddle 1438. Electrical interconnects 1422 electrically connects a first active side 1444 of the first device 1420 to the first external interconnects 1412. The electrical interconnects 1422 also connects the second device 1424 to the second external interconnects 1418 of the second device unit 1406. The partial encapsulation cuts 1450 are formed between the device units by removing the dam bars 116 of FIG. 1 resulting in electrical isolation of the external interconnects between the device units.

An encapsulation 1402 covers the first device 1420, the second device 1424, the first device unit 1404, the second device unit 1406, as well as the electrical interconnects 1422. Preferably, the encapsulation 1402 partially exposes the first external interconnects 1412, the second external interconnects 1418, the first die-attach paddle 1432, and the second die-attach paddle 1438 such that the encapsulation 1402 does not impede the connections of the external interconnects to the next system level. The encapsulation 1402 comprises a first encapsulation side 1490 and a second encapsulation side 1491, on an opposing side of the first encapsulation side 1490. The encapsulation 1402 partially exposes the first external interconnects 1412 at a first lateral side 1492 of the encapsulation 1402 and the second external interconnects 1418 at a second lateral side 1494 of the encapsulation 1402.

Each of the first external interconnects 1412 and the second external interconnects 1418 comprises a tip 1496 and a termination 1498, with the termination 1498 angled from the tip 1496 to terminate preferably above the first encapsulation side 1490. The encapsulation 1402 partially exposes the first die-attach paddle 1432, the second die-attach paddle 1438 on the second encapsulation side 1491, which together with the first external interconnects 1412 and the second external interconnects 1418 allow electrical connection to next system level connections.

Figure 15:
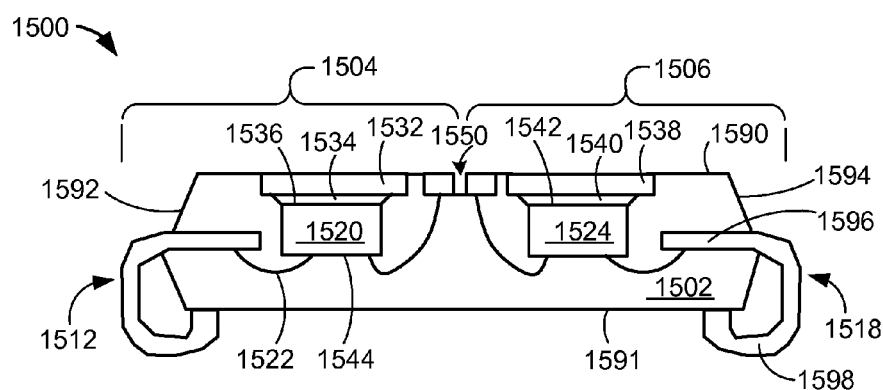
FIG. 15 is a cross-sectional view of an integrated circuit package system in a ninth embodiment of the present invention.

Referring now to FIG. 15, therein is shown a cross-sectional view of an integrated circuit package system 1500 as exemplified by the top plan view of FIG. 1 along line 2-2 in a ninth embodiment of the present invention. The integrated circuit package system 1500 includes structural similarities to the integrated circuit package system 1300 of FIG. 13. The cross-sectional view depicts a first device unit 1504 with first external interconnects 1512 and a first die-attach paddle 1532. A first device 1520 is mounted under the first die-attach paddle 1532 with a first adhesive 1534 and a first non-active side 1536 of the first device 1520 facing the first die-attach paddle 1532. A second device unit 1506 includes second external interconnects 1518 and a second die-attach paddle 1538. A second device 1524 is mounted under the second die-attach paddle 1538 with a second adhesive 1540 and a second non-active side 1542 of the second device 1524 facing the second die-attach paddle 1538. Electrical interconnects 1522 electrically connects a first active side 1544 of the first device 1520 to the first external interconnects 1512. The electrical interconnects 1522 also connects the second device 1524 to the second external interconnects 1518 of the second device unit 1506. The partial encapsulation cuts 1550 are formed between the device units by removing the dam bars 116 of FIG. 1 resulting in electrical isolation of the external interconnects between the device units.

An encapsulation 1502 covers the first device 1520, the second device 1524, the first device unit 1504, the second device unit 1506, as well as the electrical interconnects 1522. Preferably, the encapsulation 1502 partially exposes the first external interconnects 1512, the second external interconnects 1518, the first die-attach paddle 1532, and the second die-attach paddle 1538 such that the encapsulation 1502 does not impede the connections of the external interconnects to the next system level. The encapsulation 1502 comprises a first encapsulation side 1590 and a second encapsulation side 1591, on an opposing side of the first encapsulation side 1590. The encapsulation 1502 partially exposes the first external interconnects 1512 at a first lateral side 1592 and the second external interconnects 1518 at a second lateral side 1594 of the encapsulation 1502.

Each of the first external interconnects 1512 and the second external interconnects 1518 comprises a tip 1596 and a termination 1598, with the termination 1598 angled from the tip 1596 to terminate preferably below the second encapsulation side 1591. The encapsulation 1502 partially exposes the first die-attach paddle 1532, the second die-attach paddle 1538 on the first encapsulation side 1590, which together with the first external interconnects 1512 and the second external interconnects 1518 allow electrical connection to next system level connections.

Figure 16:
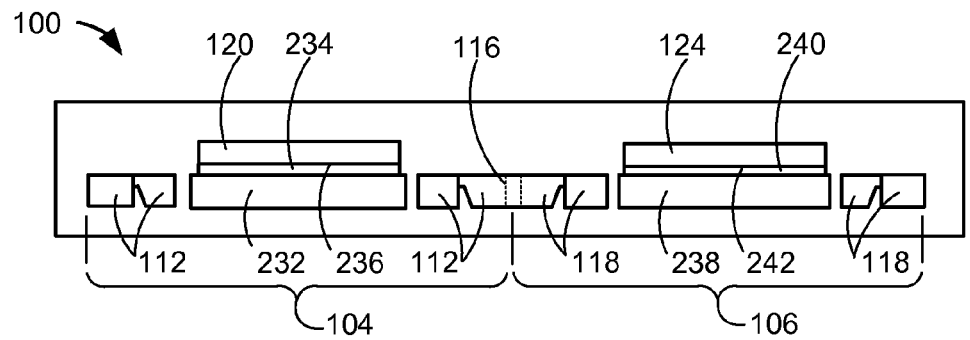
FIG. 16 is a cross-sectional view of the integrated circuit package system of FIG. 1 in a mounting phase of the multiple device units and external interconnects.

Referring now to FIG. 16, therein is shown a cross-sectional view of the integrated circuit package system 100 of FIG. 2 in a forming phase of the array of device units. The cross-sectional view depicts the first device unit 104 formed with the first external interconnects 112 and the first die-attach paddle 232. The first device 120 is mounted with the first adhesive 234, with the first non-active side 236 of the first device 120 over the first die-attach paddle 232. The second device unit 106 is formed adjacent to the first device unit 104 with the second external interconnects 118 and the second die-attach paddle 238. The second device 124 is mounted with the second adhesive 240, with the second non-active side 242 of the second device 124 over the first die-attach paddle 232. The dam bars 116, shown between dotted lines, electrically connect the first external interconnects 112 and the second external interconnects 118 between the first device unit 104 and the second device unit 106.

Figure 17:
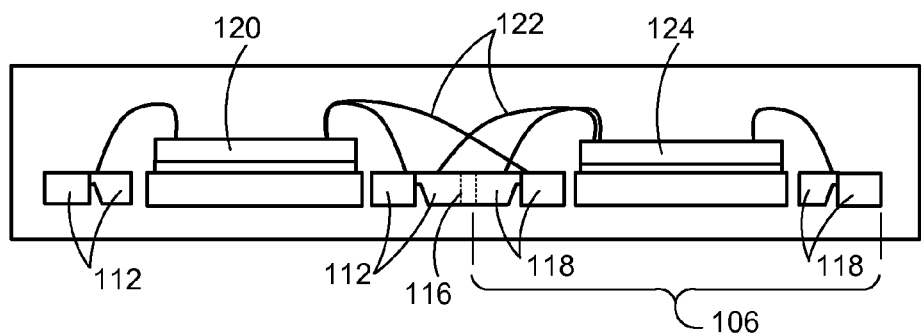
FIG. 17 is the structure of FIG. 16 in a connecting phase of a device to each device unit of the array of device units.

Referring now to FIG. 17, therein is shown the structure of FIG. 16 in a connecting phase of a device to each device unit of the array of device units. The electrical interconnects 122 electrically connect the first device 120 to the first external interconnects 112. The electrical interconnects 122 connects the first device 120 to the second external interconnects 118 of the second device unit 106. The electrical interconnects 122 connects the second device 124 to the first external interconnects 112 that is also connected to the dam bars 116.

Figure 18:
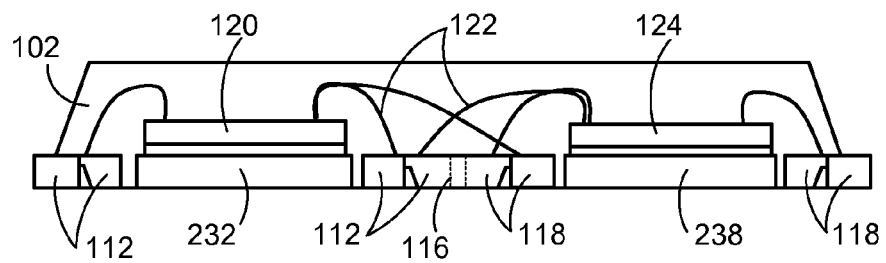
FIG. 18 is the structure of FIG. 17 in a molding phase of the multiple device units.

Referring now to FIG. 18, therein is shown the structure of FIG. 17 in a molding phase of the multiple device units. The encapsulation 102 covers the first device 120, the second device 124, and the electrical interconnects 122. Preferably, the encapsulation 102 partially exposes the first die-attach paddle 232, the second die-attach paddle 238, the first external interconnects 112, the second external interconnects 118, and the dam bars 116.

Figure 19:
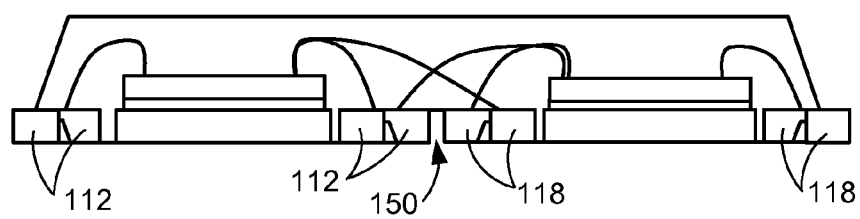
FIG. 19 is the structure of FIG. 18 in an isolation phase of the system and the external interconnects.

Referring now to FIG. 19, therein is shown the structure of FIG. 18 in an isolation phase of the external interconnects. The partial encapsulation cuts 150 removed the dam bars 116 of FIG. 18 to separate and electrically isolate the first external interconnects 112 previously connected by the dam bars 116 of FIG. 18 to the second external interconnects 118. Accordingly, the partial encapsulation cuts 150 selectively allow electrical isolation of the external interconnects between device units and thereby contributing to forming useful electrical connections.

Figure 20:
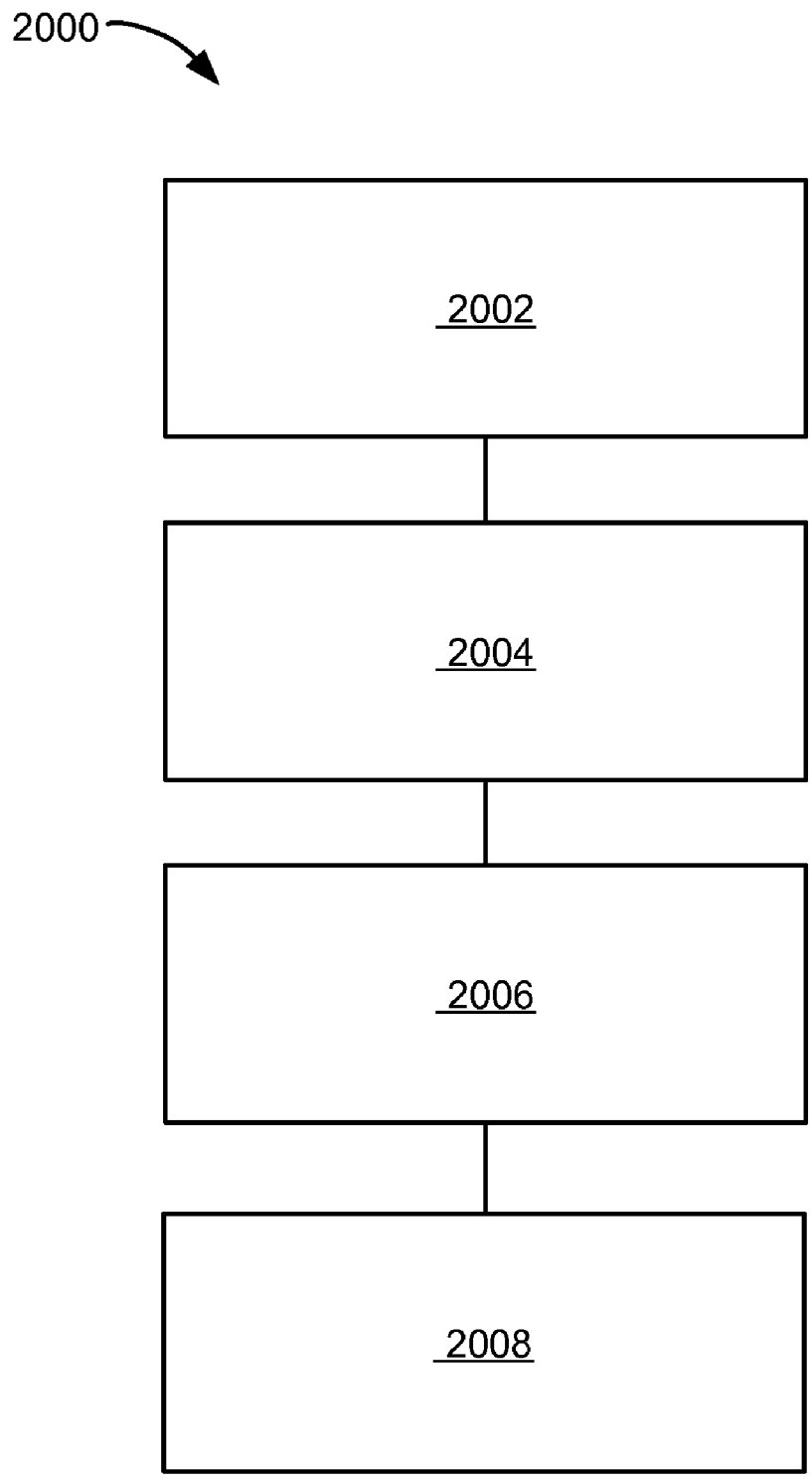
FIG. 20 is a flow chart of a circuit system for manufacturing the circuit system in an embodiment of the present invention.

Referring now to FIG. 20 is a flow chart of a circuit system 2000 for manufacturing the integrated circuit package system 100 of FIG. 1. The system 2000 includes forming a first device unit, having a first external interconnect, and a second device unit, having a second external interconnect, in an array configuration a block 2002; mounting an integrated circuit die over the first device unit in a block 2004; connecting the integrated circuit die and the first external interconnect in a block 2006; and encapsulating the integrated circuit die, the first device unit, and the second device unit with both the first external interconnect and the second external interconnect partially exposed in a block 2008.

It has been discovered that the present invention provides the integrated circuit package system 100 with reduced profile and high I/O connectivity by providing easy electrical connections between multiple device units in an array configuration. Devices of different size and configuration can also be accommodated within the array of multiple device units. It is also understood that the type of device, size and dimension of the device may vary from one device unit to another device unit. Accordingly, the integrated circuit package system 100 may accommodate multiple devices, active or passive devices, of different types, size and dimension.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects for improving yield, increasing reliability, and reducing cost of integrated circuit package system. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method for manufacturing an integrated circuit package system comprising:
    forming a first device unit, having first external interconnects arranged along a perimeter of the first device unit, and a second device unit, having second external interconnects arranged along a perimeter of the second device unit, in an array configuration;
    mounting an integrated circuit die over the first device unit;
    connecting the integrated circuit die and the first external interconnects;
    encapsulating with an encapsulation covering the integrated circuit die, the first device unit, and the second device unit with both the first external interconnects and the second external interconnects partially exposed; and
    forming a partial encapsulation cut in the encapsulation electrically isolating the first external interconnects and the second electrical interconnects.

2. The method as claimed in claim 1 further comprising connecting the integrated circuit die and the second external interconnects.

3. The method as claimed in claim 1 further comprising forming a bridging structure between the first device unit and the second device unit with the bridging structure between the first external interconnects and the second external interconnects.

4. The method as claimed in claim 1 wherein forming the first device unit and the second device unit includes forming the first device unit having a different configuration than the second device unit.

5. The method as claimed in claim 1 wherein mounting the integrated circuit die over the first device unit includes mounting the integrated circuit die over the second device unit.

6. A method for manufacturing an integrated circuit package system comprising:
    forming a first device unit, having first external interconnects arranged along a perimeter of the first device unit, and a second device unit, having second external interconnects arranged along a perimeter of the second device unit, in an array configuration;
    mounting an integrated circuit die over the first device unit;
    connecting the integrated circuit die and the first external interconnects;
    mounting a device over the second device unit;
    connecting the device and the second external interconnects;
    encapsulating with an encapsulation covering the integrated circuit die, the device, the first device unit, and the second device unit with both the first external interconnects and the second external interconnects partially exposed; and forming a partial encapsulation cut in the encapsulation electrically isolating the first external interconnects and the second electrical interconnects.

7. The method as claimed in claim 6 wherein mounting the device over the second device unit includes mounting a further integrated circuit die.

8. The method as claimed in claim 6 wherein mounting the device over the second device unit includes mounting a passive component.

9. The method as claimed in claim 6 wherein forming the first device unit and the second device unit in the array configuration includes forming the first device unit and the second device unit in an 'm' by 'n' array configuration where 'm' and 'n' are not equal.

10. An integrated circuit package system comprising:
a first device unit having first external interconnects along a perimeter of the first device unit;
a second device unit, having second external interconnects along the perimeter of the second device unit, in an array configuration with the first device unit;
an integrated circuit die over the first device unit and connected with the first external interconnects; and
an encapsulation, having a partial cut, over the integrated circuit die, the device, the first device unit, and the second device unit with both the first external interconnects and the second external interconnects partially exposed with the partial cut electrically isolating the first external interconnects and the second electrical interconnects.

11. The system as claimed in claim 10 wherein the integrated circuit die is connected with the second external interconnects.

12. The system as claimed in claim 10 further comprising a bridging structure between the first device unit and the second device unit with the bridging structure between the first external interconnects and the second external interconnects.

13. The system as claimed in claim 10 wherein the first device unit is of a different configuration than the second device unit.

14. The system as claimed in claim 10 wherein the integrated circuit die is over the second device unit.

15. The system as claimed in claim 10 further comprising:
a device over the second device unit and connected with the second external interconnects; and
wherein:
the encapsulation is over the device.

16. The system as claimed in claim 15 wherein the device includes a further integrated circuit die.

17. The system as claimed in claim 15 wherein the device includes a passive component.

18. The system as claimed in claim 15 wherein the first device unit and the second device unit in the array configuration includes the first device unit and the second device unit in an 'm' by 'n' array configuration where 'm' and 'n' are not equal.

* * * * *